United States Patent [19]
Yamada

[11] Patent Number: 6,105,153
[45] Date of Patent: Aug. 15, 2000

[54] SEMICONDUCTOR INTEGRATED CIRCUIT AND ITS EVALUATING METHOD

[75] Inventor: Shitaka Yamada, Tokyo, Japan

[73] Assignee: NEC Corporation, Tokyo, Japan

[21] Appl. No.: 08/827,070

[22] Filed: Mar. 26, 1997

[51] Int. Cl.$^7$ ................................................. G01R 31/28
[52] U.S. Cl. ............................................................ 714/724
[58] Field of Search ................................... 714/724, 733, 714/734, 738; 324/158.1

[56] References Cited

U.S. PATENT DOCUMENTS

| | | | |
|---|---|---|---|
| 3,961,284 | 6/1976 | Flora | 331/116 R |
| 5,175,494 | 12/1992 | Yoshimori | 324/158 R |
| 5,412,580 | 5/1995 | Fulcomer et al. | 364/489 |
| 5,533,032 | 7/1996 | Johnson | 714/733 |
| 5,606,567 | 2/1997 | Agrawal et al. | 714/724 |
| 5,623,503 | 4/1997 | Rutkowski | 714/724 |
| 5,760,598 | 6/1998 | Ayers et al. | 324/765 |

FOREIGN PATENT DOCUMENTS

| | | |
|---|---|---|
| 60-123775 | 7/1985 | Japan . |
| 3-262986 | 11/1991 | Japan . |
| 4-160377 | 6/1992 | Japan . |
| 6-215061 | 8/1994 | Japan . |

OTHER PUBLICATIONS

Japanese Patent Office Action, dated Nov. 25, 1997.

*Primary Examiner*—Hoa T. Nguyen
*Attorney, Agent, or Firm*—Sughrue, Mion, Zinn, Macpeak & Seas, PLLC

[57] ABSTRACT

A semiconductor integrated circuit has a function circuit, which is composed of flip-flop (F/F) groups 1 and 1 formed by a plurality of flip-flops, a combinational circuit 3 arranged between the F/F groups 1 and 2 and formed by a plurality of paths including various logical gates, a dual input logical gate 5, an output buffer 6 and an input buffer 7. In the combinational circuit 3, there are a plurality of paths, which stretch from the output side of the F/F group 1 to the input side of the F/F group 2. However, only a critical path 20 having a largest delay time is shown. For the plurality of logical gates included in the critical path 20, only an initial stage logical gate 4 is shown and all of the logical gates which are cascade connected thereafter are omitted. Thus, a semiconductor integrated circuit and its evaluating method for easily and inexpensively performing AC testing are provided without increasing a chip size.

22 Claims, 12 Drawing Sheets

6,105,153

SEMICONDUCTOR INTEGRATED CIRCUIT AND ITS EVALUATING METHOD

BACKGROUND OF THE INVENTION

The present invention relates to a semiconductor integrated circuit and its evaluating method.

Generally, in an evaluating test which is performed for measuring the delay time of the critical path of a semiconductor integrated circuit, mainly DC and AC tests have been used. In recent years, there has been an increase in the prices of semiconductor integrated circuits, following the attainment of high performance and high integration for the semiconductor integrated circuit and the increase of its size. Thus, AC test selection has become particularly necessary for the inspection of a single semiconductor integrated circuit.

On the other hand, in order to perform an AC test similar to that for a device in the single semiconductor integrated circuit, a great number of facilities and processes are needed. For this reason, its trade-off relationship with the above-noted AC test selection for the inspection of the single semiconductor integrated circuit is one of the problems to be solved.

To take one example (conventional example 1) hitherto performed, in a typical semiconductor integrated circuit, especially in a logical LSI, automatic arranging and wiring are performed with the net list of a desired function as an input and if there is no problem found with its delay analyzing result, the process enters a wafer step and then advances to an inspecting step.

During the AC test for a sample to be measured, normally a test pattern used for function testing is created, and the operation of a desired frequency is tested for a desired evaluating function by a LSI tester, and so on.

To take another example (conventional example 2), a ring oscillator is installed beforehand in the semiconductor integrated circuit separately from an original function circuit, and by measuring the frequency of the ring oscillator by using a frequency counter, this is used instead of an AC test for the original function circuit. Referring to FIG. 12, which is a conceptual view showing the substrate arrangement example of the semiconductor integrated circuit in this conventional example, there is arranged a ring oscillator 29 corresponding to a function circuit included in a semiconductor integrated circuit 27, and there are provided signal pulling-out pads 30 and 31 corresponding to the ring oscillator 29. The content of a specific example corresponding to this conventional example 2 is disclosed in JP-A-160377/1992.

As another conventional example (conventional example 3), there has been used a method for measuring and evaluating the delay time of a part of the function circuit instead of an AC test for the function circuit in the semiconductor integrated circuit. This method will be described by referring to FIG. 13, which is a conceptual view of this semiconductor integrated circuit. In the evaluating method shown in FIG. 13, measuring is performed for a delay time T1 in a bus 36, which passes through a circuit 34 to be measured in a function circuit 33 included in a semiconductor integrated circuit 32, and a delay time T2 in a bus 37, which does not pass through the measured circuit 34, and by referring to a measured time difference between these two (T1–T2), a delay time in the measured circuit is evaluated.

However, the foregoing semiconductor integrated circuits of the conventional examples 1 to 3 have drawbacks described below.

In the case of the conventional example 1, in its evaluating method, it is generally difficult to create a test pattern, which corresponds to an original function test in the semiconductor integrated circuit, and measuring devices like a LSI tester, and so on, used for such a purpose, are very high in prices.

In the case of the conventional example 2, the built-in ring oscillator is very small in its form compared with the original function circuit, and thus when there is large non-uniformity in the characteristics of various transistors arranged in the semiconductor chip, it is difficult to obtain a correlation with an AC test characteristic for the function circuit. Consequently, the test function which is used instead of an AC test for the function circuit is lost.

Furthermore, in the case of the conventional example 3, if the number of measured circuits in the semiconductor integrated circuit is small, as in the case of the conventional example 2, it is difficult to obtain a correlation between the measuring results of the measured circuits and the AC test characteristic of the entire function circuit. If there are a number of measured circuits, the overhead of an added test circuit is large and the size of a semiconductor chip is increased.

SUMMARY OF THE INVENTION

A purpose of the present invention is to solve the above-discussed problems.

Another purpose of the present invention is to provide a semiconductor integrated circuit, in which a ring oscillator including a critical path is constituted by substitutionally connecting a plural input logical gate for specified testing to the initial stage of the critical path, and its evaluating method which is capable of performing evaluation by measuring the frequency of the oscillation output of this ring oscillator.

The purpose of the present invention is achieved by a semiconductor integrated circuit, which comprises a combinational circuit formed by the cascade connection of various logical gates and having a plurality of paths, a dual input logical gate with the output end of a critical path having a largest delay time connected to one input end and a special level signal for evaluation testing input to the other input end in the combinational circuit, a plural input logical gate arranged instead of a logical gate arranged in the initial stage of the critical path with one input end connected to the output end of the dual input logical gate, and a ring oscillator constituted by a critical path including the dual input logical gate and the plural input logical gate when function evaluation is performed.

The purpose of the present invention is also achieved by a function evaluating method used during designing of a semiconductor integrated circuit and AC testing, which comprises a first step for using the net list of a desired function as an input, a second step for performing automatic arranging and wiring on the chip of the semiconductor integrated circuit after receiving the net list input of the first step, a third step for performing delay analysis for all of a plurality of paths in a combinational circuit, which is included in the function circuit of the semiconductor integrated circuit, a fourth step for extracting a critical path having a largest delay time among the plurality of paths, which are located in the combinational circuit, based on the result of the delay analysis, a fifth step for connecting a specified plural input logical gate for testing by substituting a logical gate in the initial stage of the critical path and forming a ring oscillator, which includes the critical path, and a sixth step for performing an AC test for evaluation by setting the ring oscillator to an oscillation mode and measuring the frequency of its oscillation output with a frequency counter.

The present invention is effective for performing very easy and inexpensive AC testing, because the critical path is extracted via delay analysis based on wiring information after automatic arranging and wiring, the ring oscillator including the critical path is constituted by substitutionally connecting the specified plural input logical gate for testing to the initial stage of the critical path, the frequency of the oscillation output of this ring oscillator is measured and its delay time is evaluated.

The present invention is also effective for obtaining the same evaluation condition as that for operating the function circuit by a real frequency, because the overhead of a testing circuit is reduced and an AC test targets the critical path.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

The first embodiment of the present invention will be described below with reference to the accompanying drawings.

Figure 1:
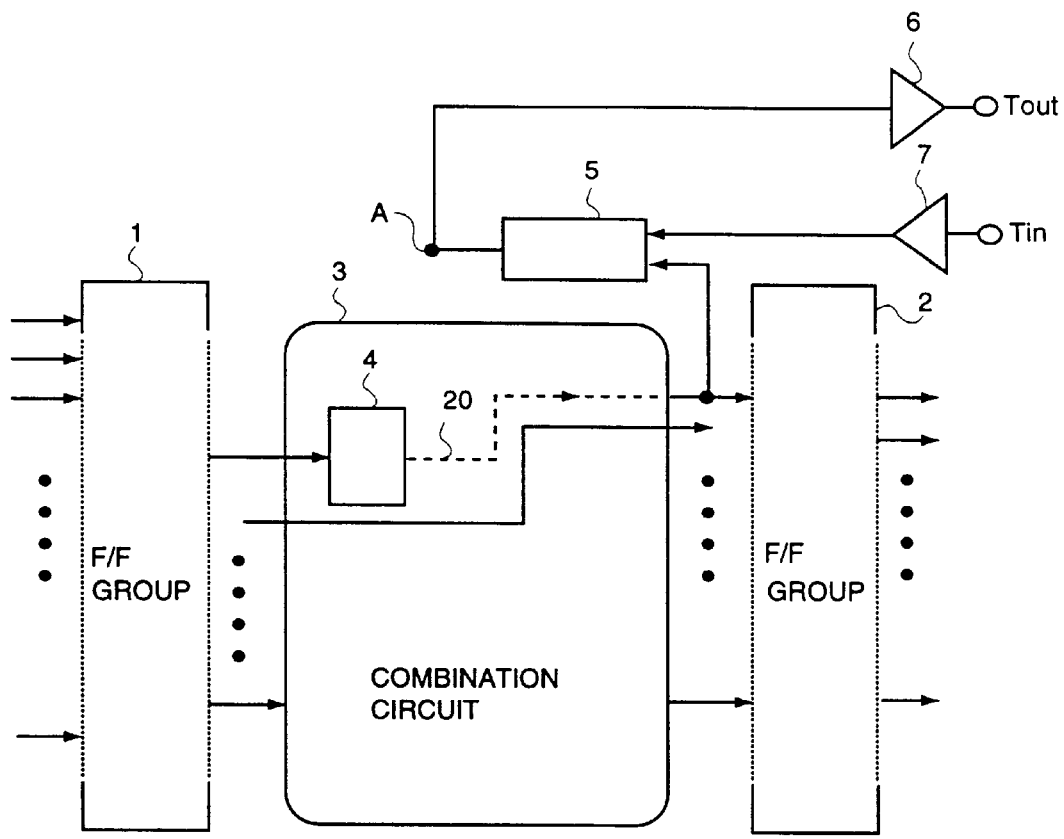
FIG. 1 is a view illustrating an embodiment of the present invention.

FIG. 1 is a conceptual constitutional view of the semiconductor integrated circuit of the first embodiment.

Referring to FIG. 1, a function circuit is composed of flip-flop groups (referred to as F/F groups, hereinafter) 1 and 2, a combinational circuit 3 formed by a plurality of paths including a logical gate, which is arranged between the F/F groups 1 and 2, a dual input logical gate 5 and an output buffer 6.

In the combinational circuit 3, there are provided a plurality of paths, which stretch from the output side of the F/F group 1 to the input side of the F/F group 2 and include various logical gates. In FIG. 1, however, only a critical path 20 having a largest delay time among these is shown and the other paths are omitted for the purpose of explanation. For the plurality of logical gates included in the critical path 20, only an initial stage logical gate 4 is shown and all of various logical gates cascade connected thereafter are omitted.

Figure 2:
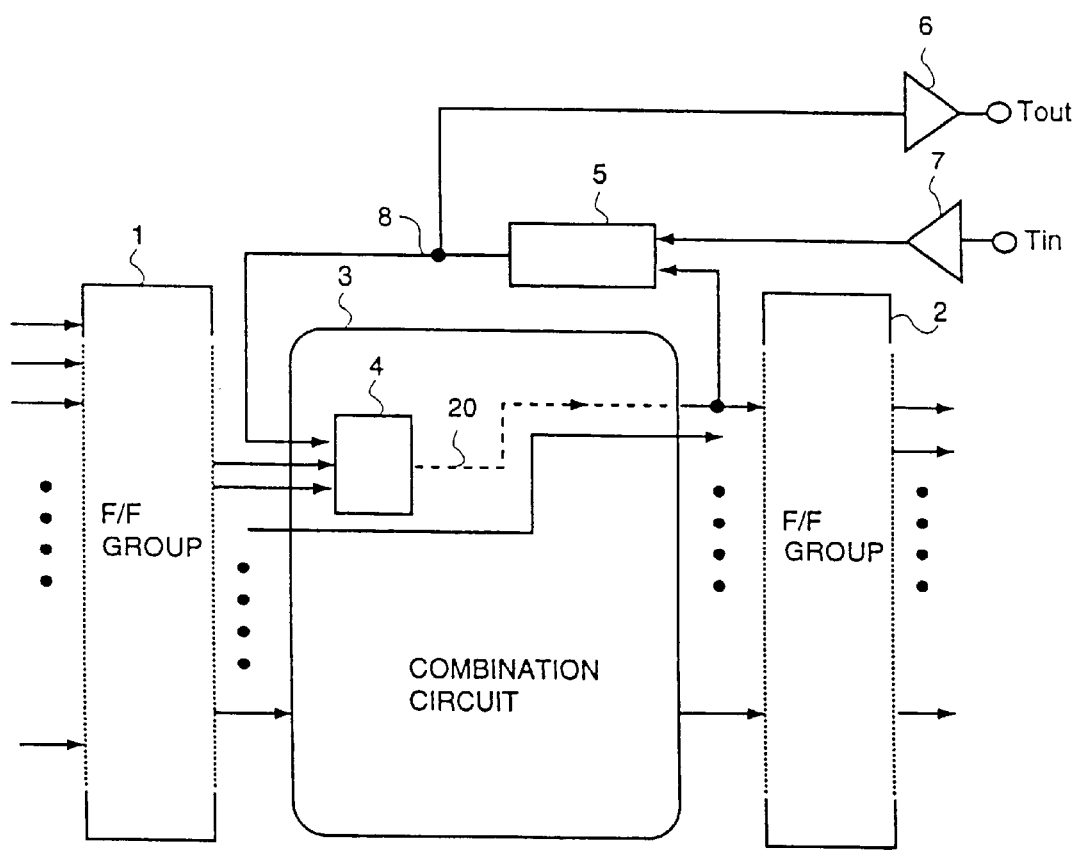
FIG. 2 is a block diagram showing a circuit structure for evaluation testing of the first embodiment.

In the first embodiment, when evaluation is to be performed during designing or AC testing, as shown in FIG. 2, the initial stage logical gate 4 of the critical path of the combinational circuit 3 is taken out and a plural input logical gate 8 is arranged and connected instead. An original signal line from the F/F 1 is connected to one input end of the plural input logical gate 8. A point "A" in the output side of the dual input logical gate 5 shown in FIG. 1 is connected to another input end. More particularly, instead of the logical gate 4, the plural input logical gate 8 as a test circuit is added to the critical path 20, and a feedback loop circuit is formed by the critical path 20, which includes this plural input logical gate 8, and the dual input logical gate 5.

In this case, conditions for defining the dual input logical gate 5 and the plural input logical gate 8 are as follows.

(1) When an evaluation specifying signal Tin is input through an input buffer 7 to the dual input logical gate 5 at a particular logical level, the feedback loop circuit formed by the critical path 20, which includes the dual input logical gate 5 and the plural input logical gate 8, should be constituted as a ring oscillator.

(2) When an evaluation specifying signal Tin is input through the input buffer 7 to the dual input logical gate 5 at a logical level reverse to the above-noted particular logical level, the output level of the critical path 20 including the plural input logical gate 8, which corresponds to the input signal of the F/F 1, should be the same as the output level of the critical path 20 including the logical gate shown in FIG. 1 as an original mode, which corresponds to the input signal of the F/F 1.

The dual input logical gate 5 and the plural input logical gate 8 are decided so as to satisfy the foregoing conditions. When evaluation is to be performed during designing or AC testing, a testing circuit is constituted, as described above, by defining the dual input logical gate 5 and the plural input logical gate 8 based on the initial stage logical gate 4 of the critical path 20 in the combinational circuit 3 shown in FIG. 1 and under the foregoing conditions. Then, by keeping the evaluation specifying signal Tin at the foregoing particular logical level, the feedback loop circuit composed of the dual input logical gate 5 and the critical path 20 is used as a ring oscillator. Then, the frequency of an evaluation output signal, which is output from the dual input logical gate 5 and output by oscillation through an output buffer 6 to the outside, is measured by using an external frequency counter, and thereby AC testing for evaluation of the semiconductor integrated circuit is performed.

In addition, by causing the evaluation specifying signal Tin to be at the logical level reverse to the foregoing particular logical level, the feedback loop circuit is released from its function as a ring oscillator, and the combinational circuit 3 is returned to its original combination circuit function shown in FIG. 1.

Figure 3:
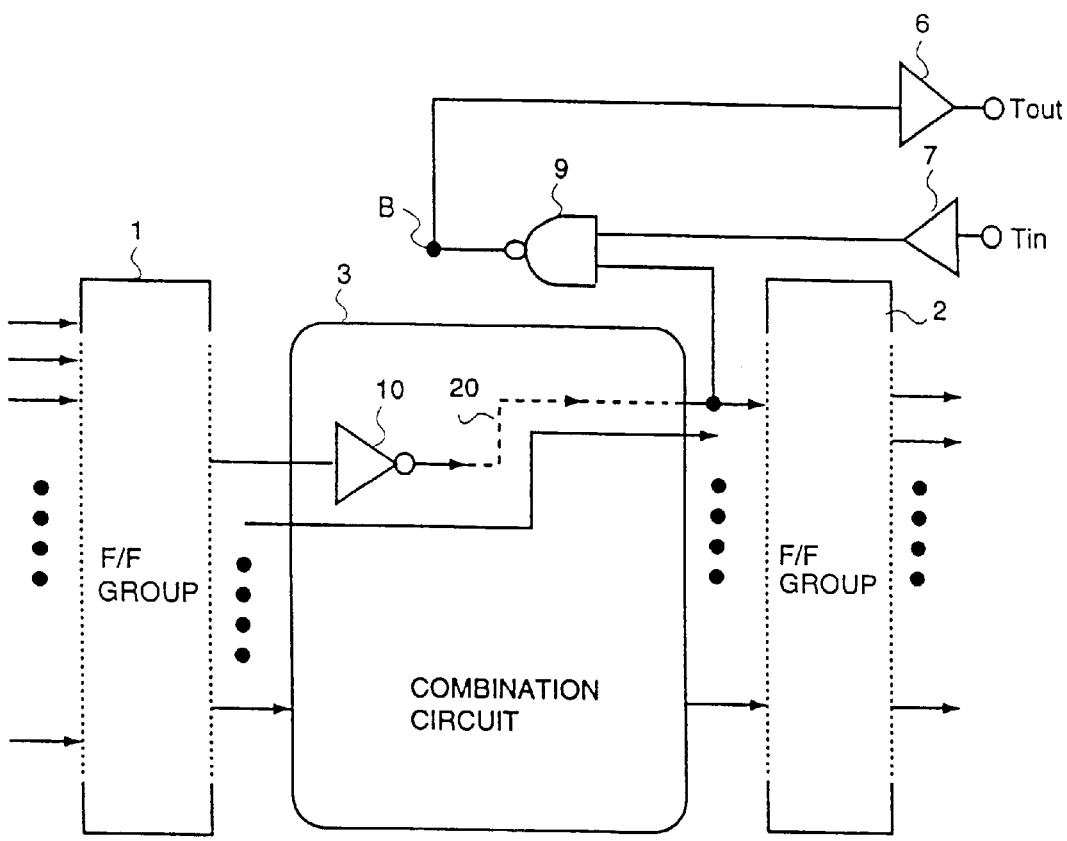
FIG. 3 is a block diagram showing a specific circuit structure of the first embodiment.

FIG. 3 is a block diagram showing a specific circuit corresponding to the first embodiment shown in FIG. 1. Referring to FIG. 3, the logical gate 4 of FIG. 1 is composed of an inverter 10 and the dual input logical gate 5 is composed of a dual input NAND gate 9.

Figure 4:
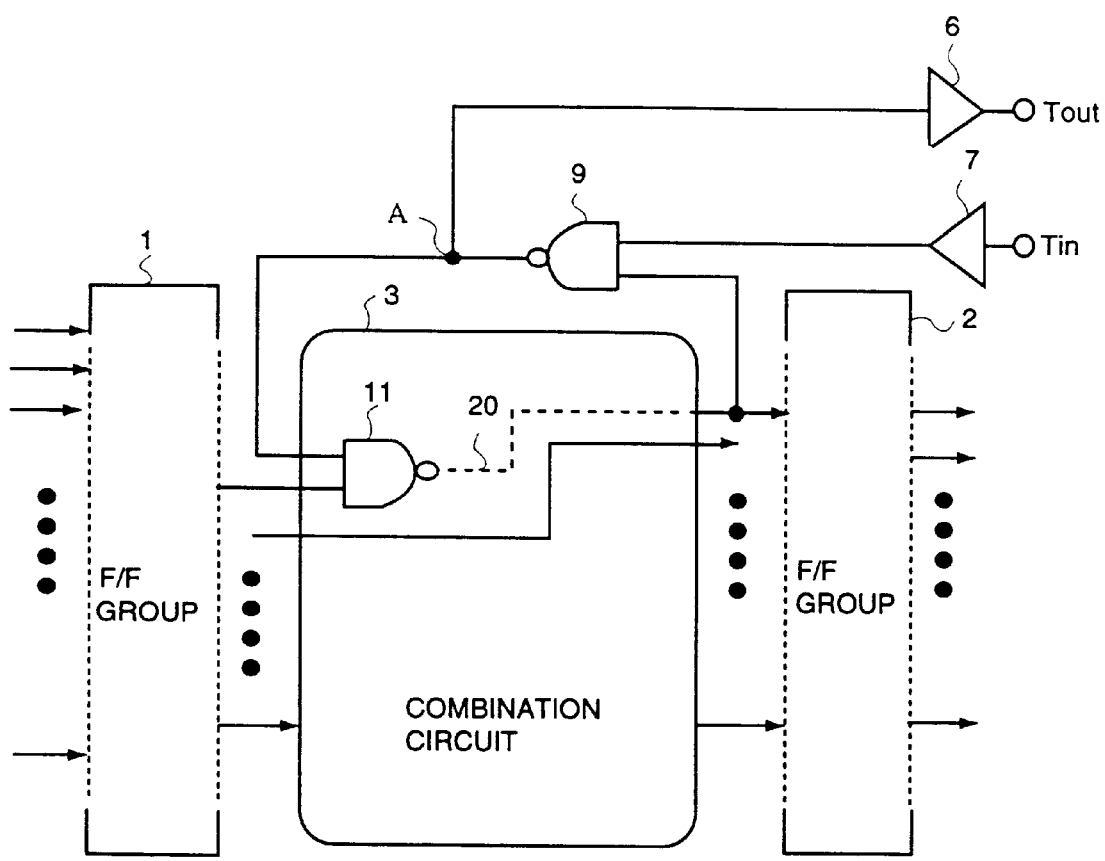
FIG. 4 is a block diagram showing a specific circuit structure for evaluation testing of the first embodiment.

When evaluation is to be performed for the specific circuit shown in FIG. 3 during designing and AC testing, as shown in FIG. 4, the initial stage inverter 10 included in the critical path 20 of the combinational circuit 3 is replaced by a dual input NAND gate 11, an original signal line from the F/F 1 is connected to one input end of the NAND gate 11, a point B in the output side of the dual NAND gate 9 shown in FIG. 3 is connected to the other input end and thereby a test evaluation circuit is formed.

A feedback loop circuit composed of the critical path 20, which includes the NAND gate 11, and the NAND gate 9, is constituted as a ring oscillator by inputting an "H" level evaluation specifying signal Tin through the input buffer to the NAND gate 9 in this condition. From the output buffer 6, the oscillation output of the ring oscillator is output as an evaluation output signal Tout to the outside. Therefore, by measuring the frequency of the evaluation output signal Tout by using the frequency counter, AC testing for evaluation of the semiconductor integrated circuit can be performed.

By causing the evaluation specifying signal Tin to be at an "L" level, the feedback loop circuit is released from its function as a ring oscillator and the combinational circuit 3 is returned to its original circuit function.

Next, the second embodiment of the present invention will be described.

Figure 5:
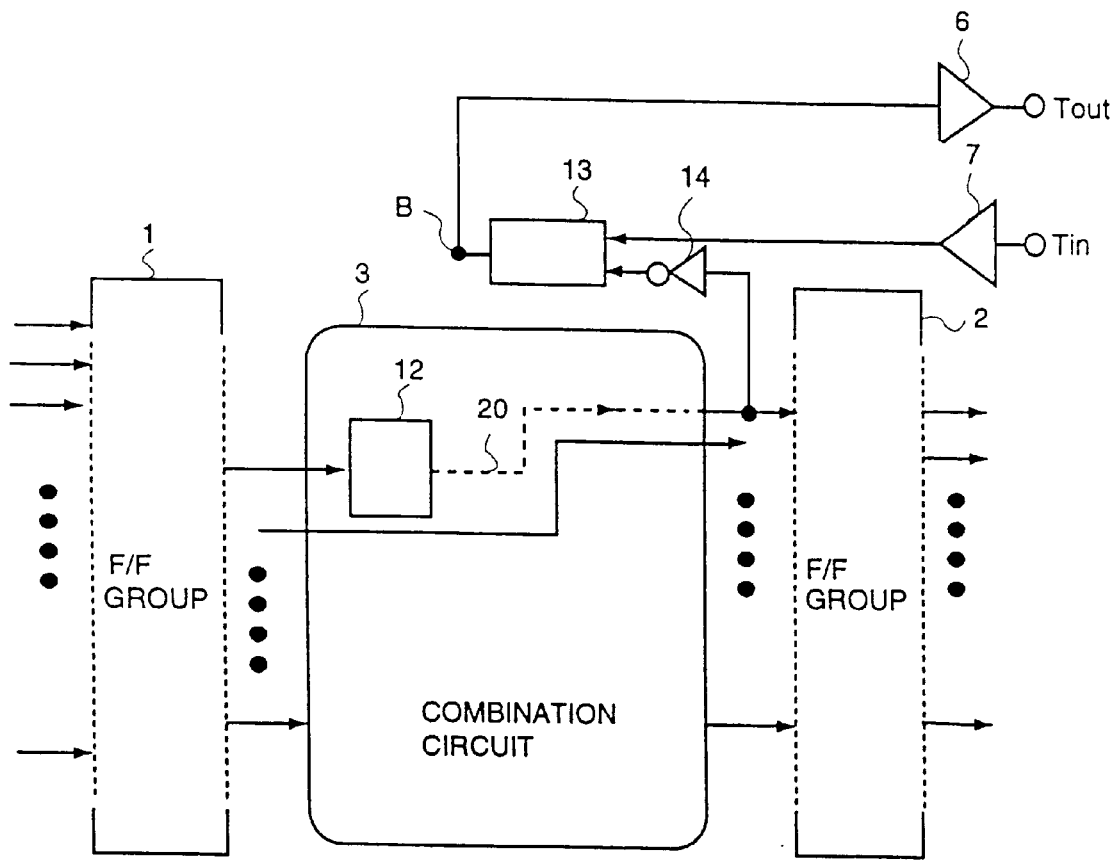
FIG. 5 is a block diagram illustrating a second embodiment of the present invention.

FIG. 5 is a conceptual constitutional view of the second embodiment. Referring to FIG. 5, a function circuit is composed of flip-flop groups (referred as F/F groups, hereinafter) 1 and 2, which are formed by a plurality of flip-flops, a combinational circuit 3 formed by a plurality of paths including a logical gate 12, which is arranged between the F/F groups 1 and 2, a dual input logical gate 13, an inverter 14, an output buffer 6 and an input buffer 7.

In the combinational circuit 3, as in the case of the first embodiment, there are provided a plurality of paths, which stretch from the output side of the F/F group 1 to the input side of the F/F group 2 and include various logical gates. However, only a critical path 20 having a largest delay time among these is shown in FIG. 5 and the other paths are omitted for the purpose of explanation. For the plurality of logical gates included in the critical path, only an initial stage logical gate 12 is shown, and the other logical gates cascade connected thereafter are all omitted.

As apparent from comparison with FIG. 1, in the second embodiment, a new inverter 14 is added to the output end of the critical path 20, and the output side of the inverter 14 is connected to one input end of the dual input logical gate 13.

Figure 6:
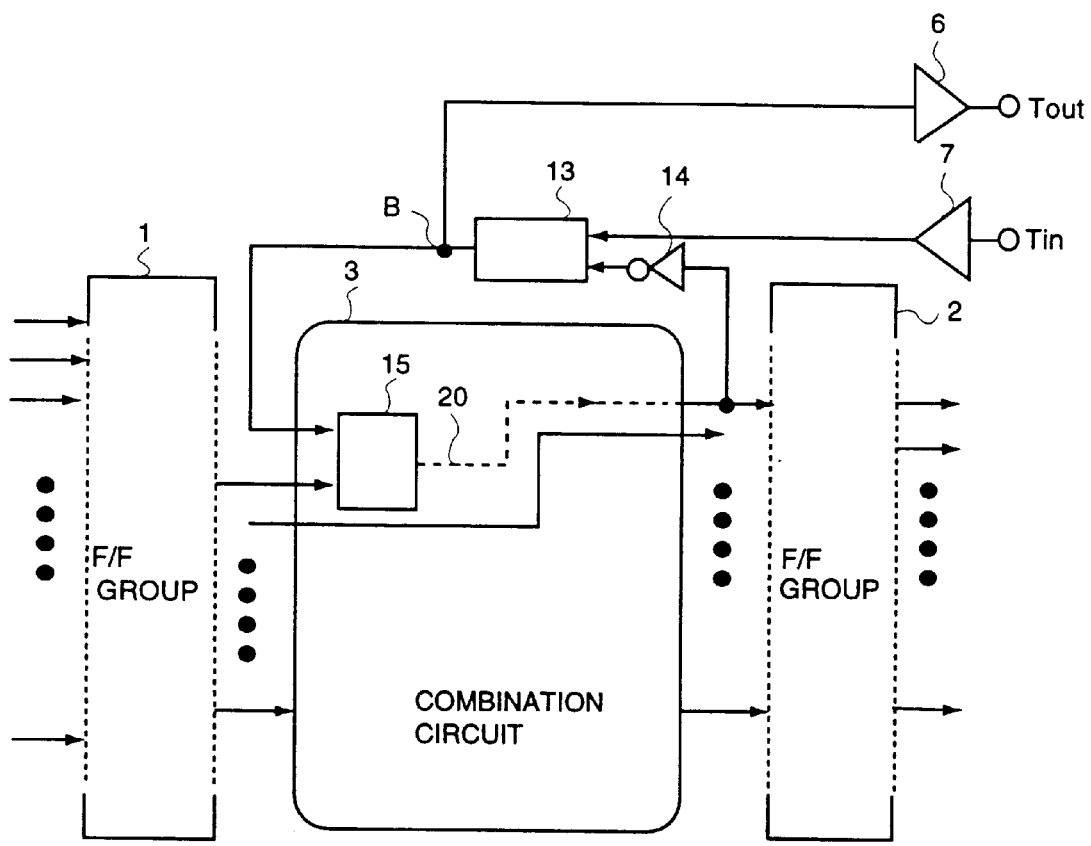
FIG. 6 is a block diagram showing a circuit structure for evaluation testing of the second embodiment.

In the second embodiment, when evaluation is to be performed during designing or AC testing, as shown in FIG. 6, the initial stage logical gate 12 of the critical path 20 of the combination circuit 3 is removed, and instead a plural input logical gate 15 is arranged and connected. An original signal line from the F/F 1 is connected to one input end of the plural input logical gate 15, and a point B in the output side of the dual input logical gate 13 shown in FIG. 5 is connected to the other input end.

That is, the plural input logical gate 15 as a testing circuit is added to the critical path 20 instead of the logical gate 12, the feedback loop circuit is formed by the critical path 20, which includes this plural input logical gate 15, the dual input logical gate 13 and the inverter 14.

In this case, conditions for defining the dual input logical gate 13 and the plural input logical gate 15 are as follows.

(1) When an evaluation specifying signal Tin is input through the input buffer 7 to the dual input logical gate 13 at a particular logical level, the feedback loop circuit formed by the dual input logical gate 13 and the plural input logical gate 15 should be constituted as a ring oscillator.

(2) When an evaluation specifying signal Tin is input through the input buffer 7 to the dual input logical gate 13 at a logical level reverse to the foregoing particular logical level, the output level of the critical path including the plural input logical gate 15, which corresponds to the input signal of the F/F 1, should be the same as the output level of the critical path 20 including the logical gate 12 as an original mode shown in FIG. 5, which corresponds to the input signal of the F/F 1.

The dual input logical gate 13 and the plural input logical gate 15 are decided so as to satisfy the foregoing conditions.

When evaluation is to be performed during designing or AC testing, as described above, corresponding to the initial stage logical gate 12 of the critical path 20 in the combination circuit 3 shown in FIG. 5, and as shown in FIG. 6, under the foregoing conditions the dual input logical gate 13 and the plural input logical gate 15 are defined and thereby a testing circuit is constituted. Then, by causing the evaluation specifying signal Tin to be at the foregoing particular level, the feedback loop circuit, which is composed of the dual input logical gate 13, the inverter 14 and the critical path 20 including plural input logical gate 15, is used as a ring oscillator. Then, by measuring the frequency of an evaluation output signal Tout, which is output from the dual input logical gate and output by oscillation through the output buffer 6 to the outside, by using a frequency counter, AC testing for evaluation of the semiconductor integrated circuit is performed.

In addition, by causing the evaluation specifying signal Tin to be at a logical level reverse to the foregoing particular logical level, the feedback loop circuit is released from its function as a ring oscillator, and the combination circuit 3 is returned to the original combination circuit function shown in FIG. 5.

Figure 7:
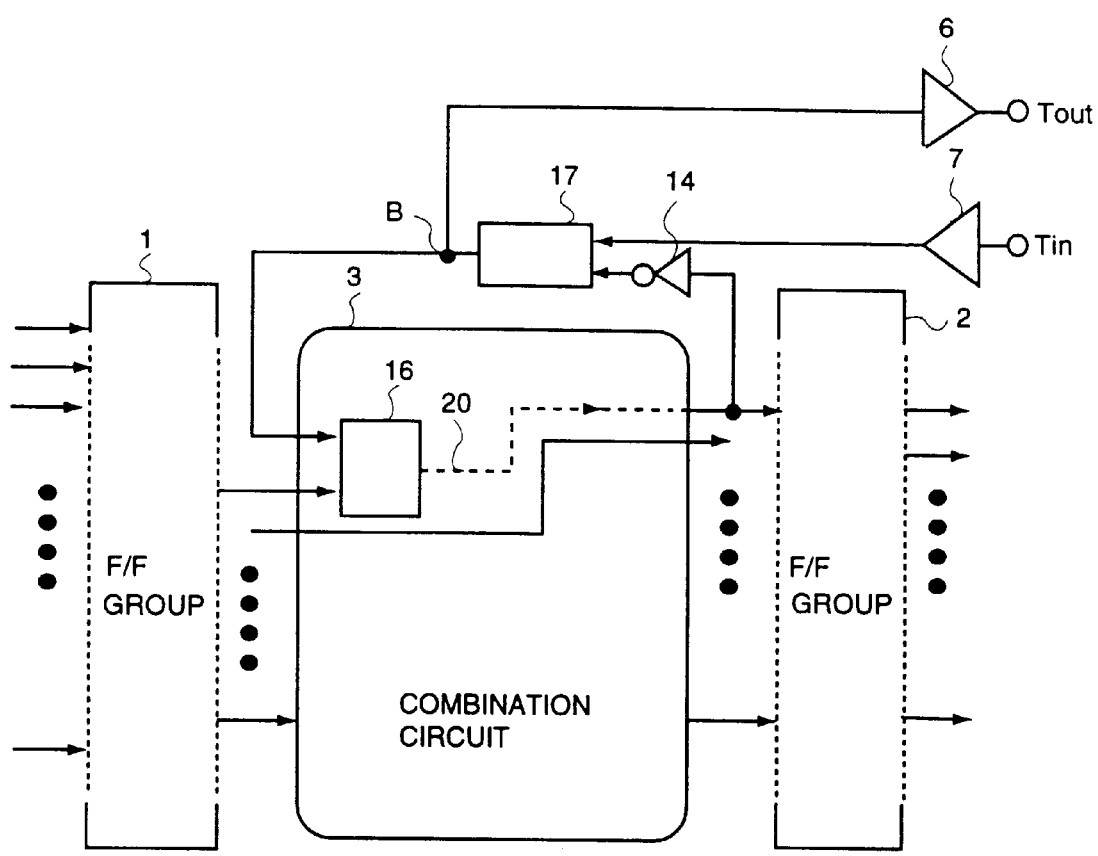
FIG. 7 is a block diagram showing a specific circuit structure of the second embodiment.

FIG. 7 is a block diagram showing a specific circuit corresponding to the second embodiment shown in FIG. 5. Referring to FIG. 7, the logical gate 12 of FIG. 5 is composed of an inverter 16, and the input logical gate 13 is composed of a dual input NAND gate 17.

Figure 8:
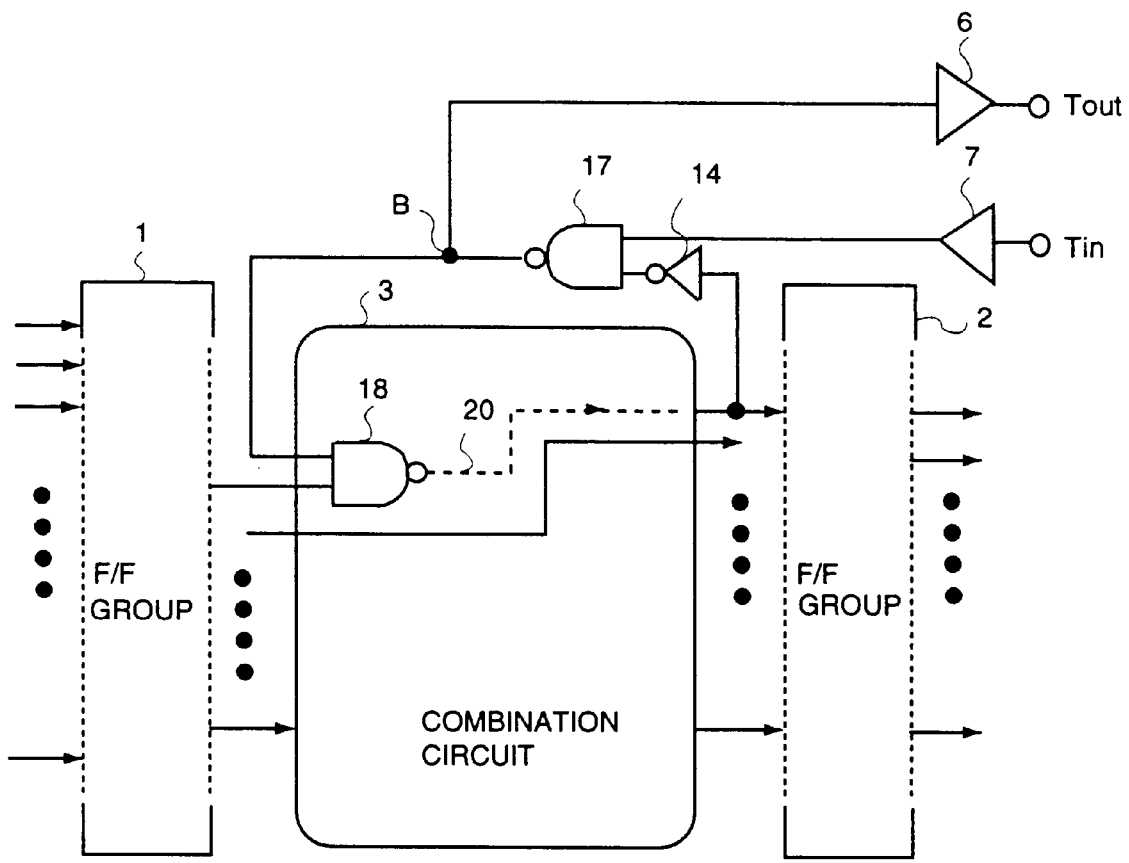
FIG. 8 is a block diagram showing a specific circuit structure for evaluation testing of the second embodiment.

When evaluation is to be performed for the circuit of FIG. 7 during designing or AC testing, as shown in FIG. 8, the initial stage inverter 16 included in the critical path 20 of the combination circuit 3 is replaced by a dual input NAND gate 18, an original signal line from the F/F 1 is connected to one input end of the NAND gate 18, a point B in the output side of the dual input NAND gate 17 of FIG. 7 is connected to the other input end, and thereby a testing evaluation circuit is constituted. By inputting an "H" level evaluation specifying signal Tin through the input buffer to the NAND gate 17 in this condition, the feedback loop circuit, which is composed of the critical path 20 including the NAND gate 18, the NAND gate 17 and the inverter 14, becomes a ring oscillator. From the output buffer 6, the oscillation output of the ring oscillator is output as an evaluation output signal Tout to the outside. Therefore, by measuring the frequency of the evaluation output signal Tout by using the frequency counter, AC testing for evaluation of the semiconductor integrated circuit can be performed.

Furthermore, by causing the evaluation specifying signal Tin to be at an "L" level, the feedback loop circuit is released from its function as a ring oscillator and the combination circuit 3 is returned to its original circuit function.

The third embodiment of the present invention will be described below with reference to the accompanying drawings.

Figure 9:
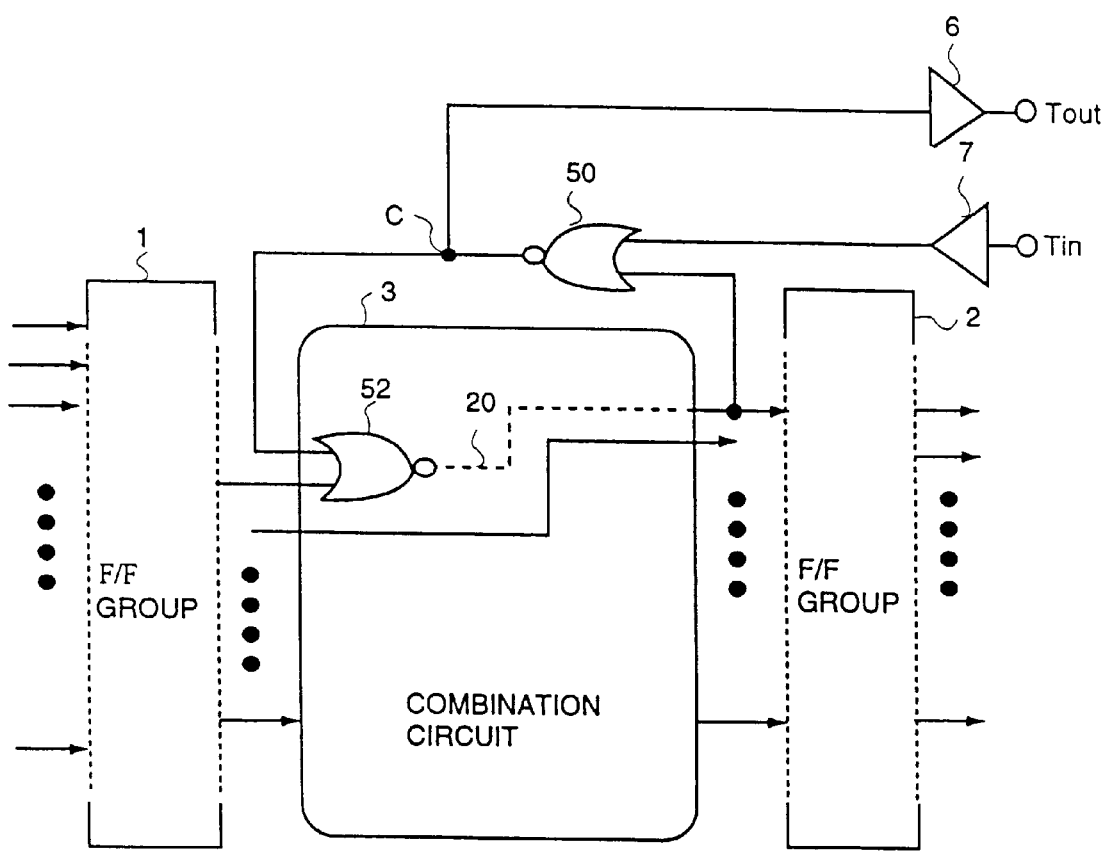
FIG. 9 is a block diagram showing a specific circuit structure for evaluation testing of a third embodiment.

FIG. 9 is a block diagram showing the circuitry of the semiconductor integrated circuit of the third embodiment.

In the third embodiment, a NOR gate 50 is used instead of the dual input logical gate 5 of the first embodiment, and a NOR gate 52 as a gate for replacing the initial stage logical gate 4. The other parts of the constitution are the same as those of the first embodiment and thus explanation thereof will be omitted.

When evaluation is to be performed for the specific circuit shown in FIG. 8 during designing or AC testing, the dual input NOR gate 52, an original signal line from the F/F 1 is connected to one input end of the NOR gate 52, a point C in the output side of the dual input NOR gate 50 shown in FIG. 9 is connected to the other input end, and thereby a testing evaluation circuit is formed.

By inputting an "H" level evaluation specifying signal Tin through the input buffer to the NOR gate 50 in this condition, the feedback loop circuit composed of the critical path 20, which includes the NOR gate 52, and the NOR gate 50, is constituted as a ring oscillator. From the output buffer 6, the oscillation output of the ring oscillator is output as an evaluation output signal Tout to the outside. Therefore, by measuring the frequency of the evaluation output signal Tout by using the frequency counter, AC testing for evaluation of the semiconductor integrated circuit can be performed.

Furthermore, by causing the evaluation specifying signal Tin to be at an "L" level, the feedback loop circuit is released from its function as a ring oscillator and the combinational circuit 3 is returned to its original circuit function.

The fourth embodiment of the present invention will be described below with reference to the accompanying drawings.

Figure 10:
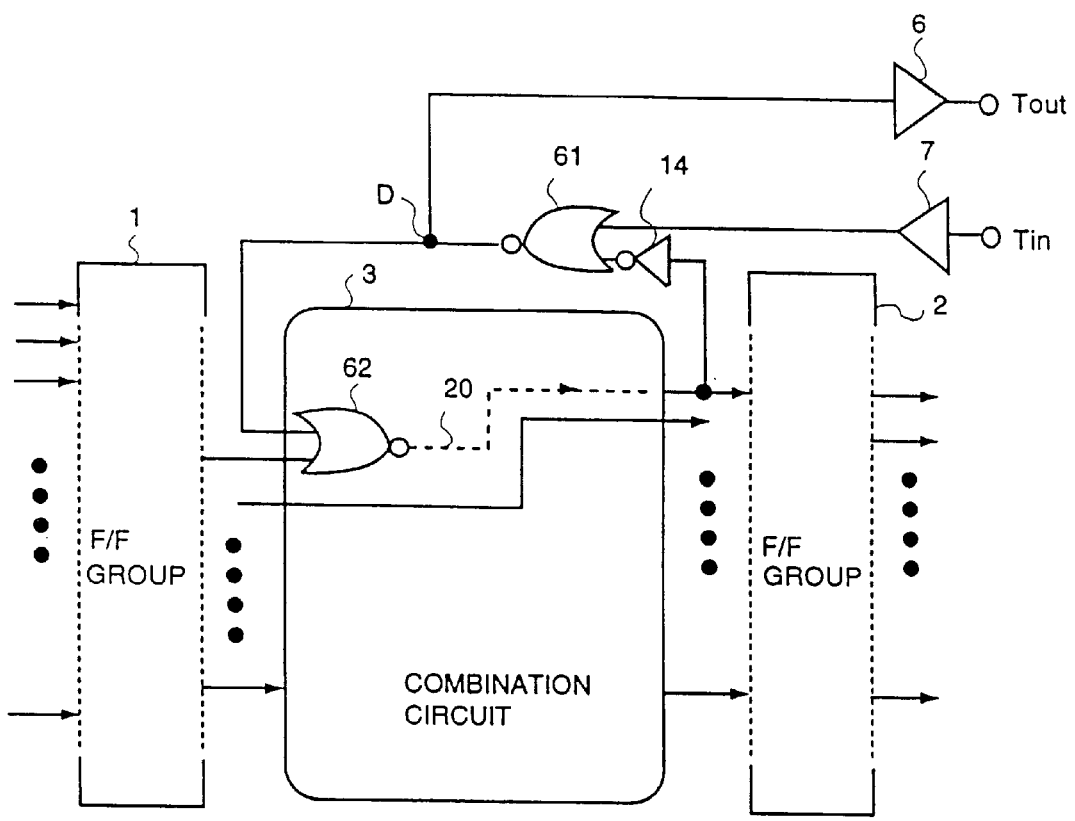
FIG. 10 is a block diagram showing a specific circuit structure for evaluation testing of a fourth embodiment.

FIG. 10 is a block diagram showing the circuitry of the semiconductor integrated circuit of the fourth embodiment.

In the fourth embodiment, a NOR gate 61 is used instead of the dual input logical gate 13 of the second embodiment and a NOR gate 62 as a gate for replacing the inverter 61 initial stage logical gate 12. The other parts of the constitution are the same as those of the second embodiment and thus explanation thereof will be omitted. When evaluation is to be performed for the specific circuit shown in FIG. 10 during designing or AC testing, the dual input NOR gate 62, an original signal line from the F/F 1 is connected to one input end of the NOR gate 62, a point D in the output side of the dual input NOR gate 61 of FIG. 10 is connected to the other input end, and thereby a testing evaluation circuit is formed.

By inputting an "H" level evaluation specifying signal Tin through the input buffer to the NOR gate 61 in this condition, the feedback loop circuit composed of the critical path 20, which includes the NOR gate 62, the NOR gate 61 and the inverter 14 is constituted as a ring oscillator. From the output buffer 6, the oscillation output of the ring oscillator is output as an evaluation output signal Tout to the outside. Therefore, by measuring the frequency of the evaluation output signal Tout by using the frequency counter, AC testing for evaluation of the semiconductor integrated circuit can be performed.

Furthermore, by causing the evaluation specifying signal Tin to be at an "L" level, the feedback loop circuit is released from its function as a ring oscillator and the combinational circuit 3 is returned to its original circuit function. The operations regarding the first and second embodiments have been described including their specific modes. Also, as described above, when a ring oscillator is constituted during designing or evaluation testing, the initial stage inverter of the critical path is replaced by the NAND gate or the NOR gate. However, since an input can be freely set to an "H" level or an "L" level via a scan path during AC testing of function evaluation by constituting the F/F in the input side as a scan register, the NAND gate or the NOR gate may be decided to be any one of the logical gates beforehand.

Figure 11:
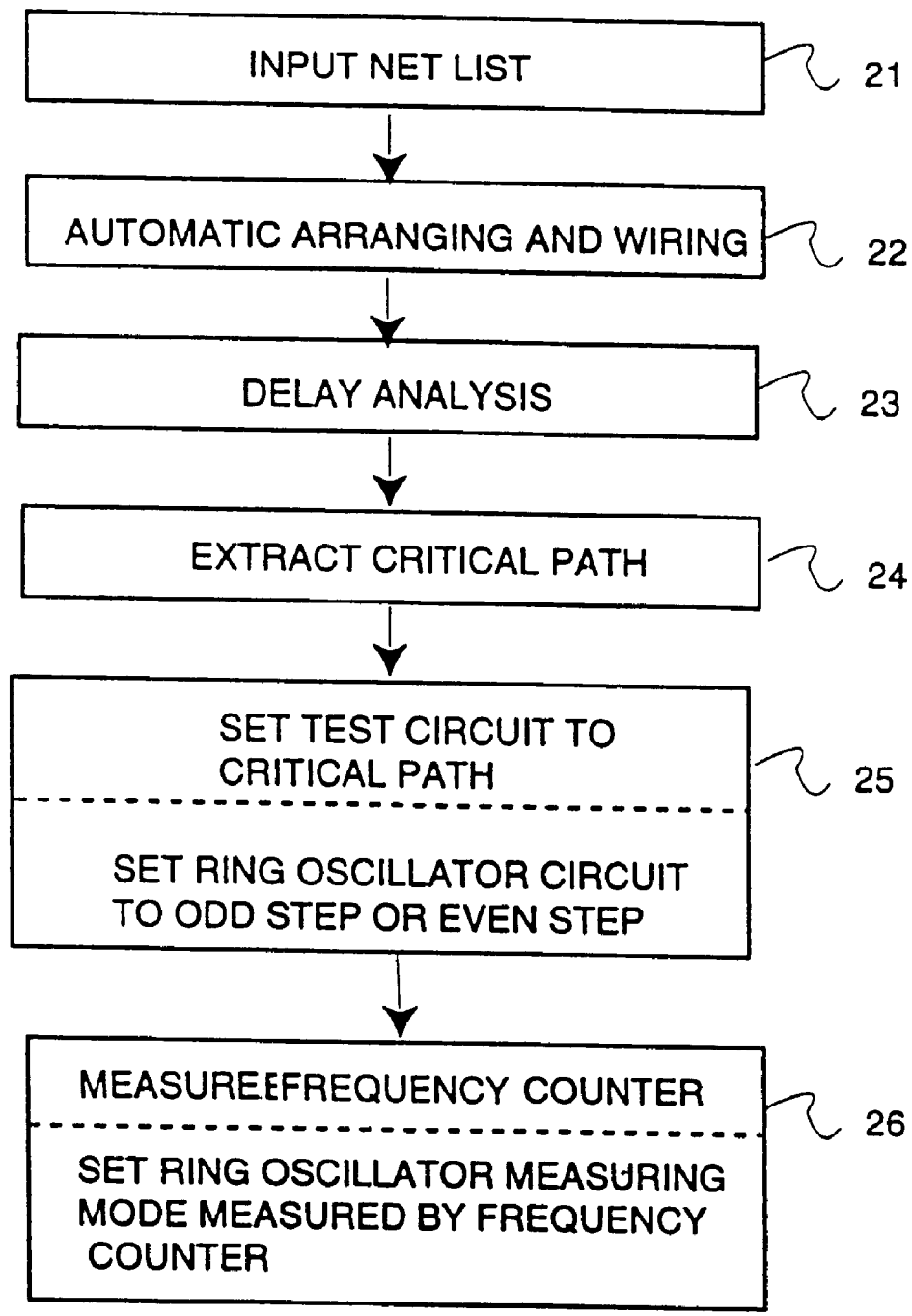
FIG. 11 is a flow chart showing a procedure of an evaluating method of the present invention.
Figure 12:
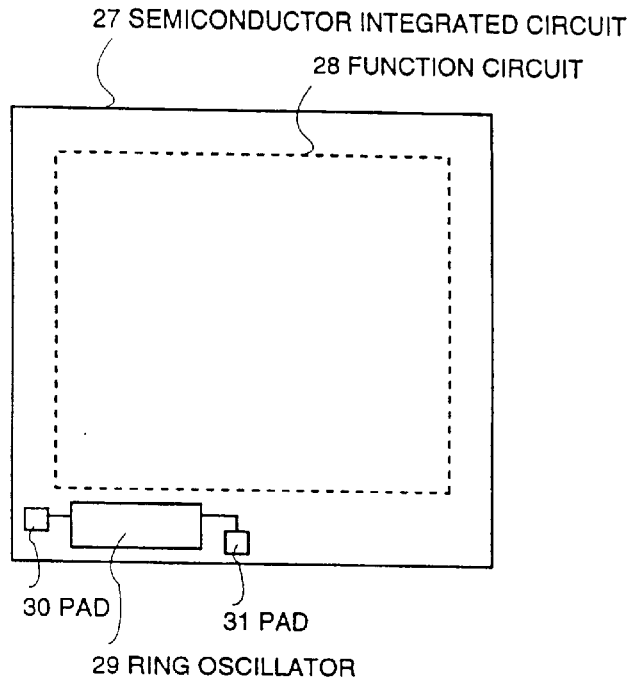
FIG. 12 is a view illustrating a prior art.
Figure 13:
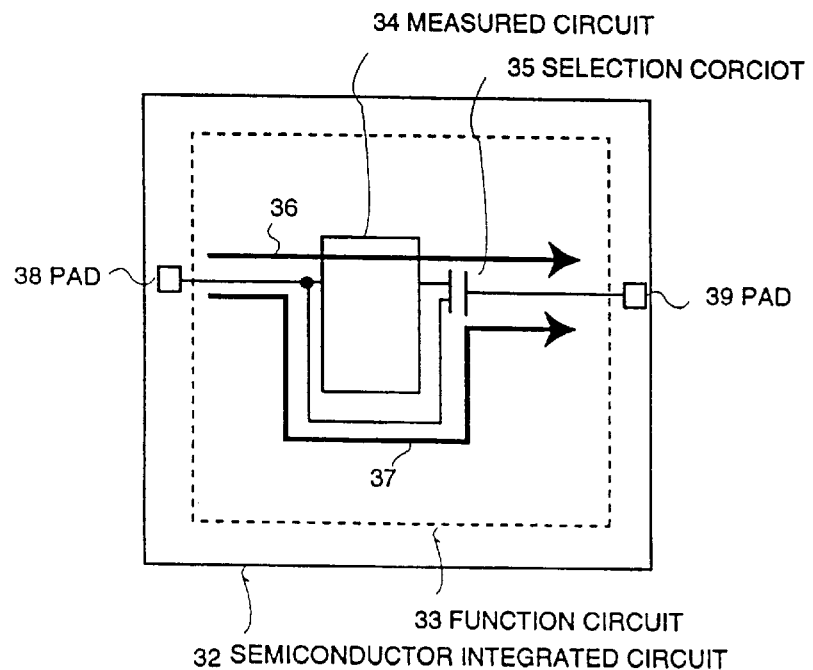
FIG. 13 is a view illustrating another prior art.

Next, the procedure of the evaluating method of the semiconductor integrated circuit of the present invention will be described. FIG. 11 is a flow chart showing an evaluating procedure during designing or AC testing in the first or the second embodiment. First, by using the net list of a desired function as an input (step 21), automatic arranging and wiring are performed (step 22).

Then, delay analysis is performed for all of the plurality of paths including various logical gates, which form the combination circuit arranged between the input side F/F group and the output side F/F group (step 23).

Then, a critical path having a largest delay time among the plurality of paths, which are located inside the combination circuit, is extracted normally by means of an automatic program (step 24), a particular plural input logical gate is connected by replacing the initial stage logical gate of the critical path, and a ring oscillator including the critical path is formed (step 25).

Lastly, by setting the ring oscillator to an oscillation mode, the frequency of its oscillation output is measured by the frequency counter and AC testing for evaluation is performed (step 26).

The entire disclosure of Japanese Patent Application No. 7-251574 filed on Sep. 28, 1995 including specification, claims, drawings and summary is incorporated herein by reference in its entirety.

What is claimed is:

1. A semiconductor integrated circuit comprising:

a combinational circuit having a plurality of paths;

a dual input logical gate, to one input end of which an output end of a critical path having a largest delay time in said combinational circuit is connected, and to another input end of which a particular level signal for evaluation testing is input; and a plural input logical gate, which is arranged in an initial stage of said critical path and one input end of which is connected to an output end of said dual input logical gate.

2. The semiconductor integrated circuit of claim 1, wherein when said evaluation testing is performed, a ring oscillator is formed by said dual input logical gate and said critical path including said plural input logical gate.

3. The semiconductor integrated circuit of claim 2, wherein said dual input logical gate and said plural input logical gate are constituted in a manner that when a signal of an output level passing through an inverter and logically inverted from an output level of said particular level signal is input to said plural input logical gate, an input/output level of said critical path including said plural input logical gate coincides with an input/output level of said initial stage critical path including said plural input logical gate.

4. The semiconductor integrated circuit of claim 2, further comprising:

an input buffer, to which said particular level signal is input; and and output buffer, from which an oscillation signal of said ring oscillator is output.

5. The semiconductor integrated circuit of claim 1, further comprising:

a plurality of flip-flops, which are arranged in an input side and connected to said combinational circuit; and a plurality of flip-flops, which are arranged in an output side and connected to said combinational circuit.

6. The semiconductor integrated circuit of claim 1, wherein said critical path has an initial stage logical gate which is an inverter, and said dual input logical gate and said plural input logical gate are respectively dual input NAND gates.

7. The semiconductor integrated circuit of claim 1, wherein said critical path has an initial stage logical gate which is an inverter, said dual input logical gate is a dual input NOR gate and said plural input logical gate is a dual input NOR gate.

8. The semiconductor integrated circuit of claim 1, further comprising an inverter, which is connected to an output end of said critical path and an input end of said dual input logical gate.

9. A semiconductor integrated circuit which is evaluated for its function by automatically wiring and arranging logical paths with a net list of a built-in function circuit as an input, extracting a critical path having a largest delay time in a combinational circuit included in said function circuit and measuring a delay time of said critical path, said semiconductor integrated circuit comprising:

a plurality of flip-flops, which are arranged in an input side;

a plurality of flip-flops, which are arranged in an output side;

a combinational circuit, which includes a plurality of paths and is formed by a cascade connection of various logical gates for interconnecting said input side plurality of flip-flops and said output side plurality of flip-flops;

a dual input logical gate, to one input end of which an output end of a critical path having a largest delay time in said combinational circuit is connected, and to another input end of which a particular level signal for evaluation testing is input; and a plural input logical gate, which is arranged instead of a logical gate arranged in an initial stage of said critical path when function testing is performed, to one input end of which an output end of said dual input logical gate is connected and which is caused to function on behalf of said logical gate, wherein when said function evaluation is performed, a ring oscillator is formed by said dual input logical gate and said critical path including said plural input logical gate.

10. The semiconductor integrated circuit of claim 9, wherein said dual input logical gate and said plural input logical gate are constituted in a manner that when a signal of an output level passing through an inverter and logically inverted from an output level of said particular level signal is input to said plural input logical gate, an input/output level of said critical path including said plural input logical gate coincides with an input/output level of said initial stage critical path including said plural input logical gate.

11. The semiconductor integrated circuit of claim 9, wherein said critical path has an initial stage logical gate which is an inverter, and said dual input logical gate and said plural input logical gate are respectively dual input NAND gate.

12. The semiconductor integrated circuit of claim 9, wherein said critical path has an initial stage logical gate which is an inverter, said dual input logical gate is a dual input NOR gate and said plural input logical gate is a dual input NOR gate.

13. The semiconductor integrated circuit of claim 9, further comprising:

an input buffer, to which said particular level signal is input; and an output buffer, from which an oscillation signal of said ring oscillator is output.

14. A semiconductor integrated circuit which is evaluated for its function by performing automatic wiring arranging with a net list of a built-in function circuit, extracting a critical path having a largest delay time in a combinational circuit included in said function circuit and measuring a delay time of said critical path, said semiconductor integrated circuit comprising:

a plurality of flip-flops, which are arranged in an input side;

a plurality of flip-flops, which are arranged in an output side;

a combinational circuit, which includes a plurality of paths and is formed by a cascade connection of various logical gate for interconnecting said input side plurality of flip-flops and said output side plurality of flip-flops;

an inverter, to an input end of which an output of a critical path having a largest delay time in said combinational circuit is connected;

a dual input logical gate, to one input end of which an output end of said inverter is connected, and another input end of which a particular level signal for evaluation testing is input; and a plural input logical gate, which is arranged instead of a logical gate arranged in an initial stage of said critical path when function evaluation is performed, to one input end of which an output end of said dual input logical gate is connected, and which is caused to function on behalf of said logical gate, wherein when said function evaluation is performed, a ring oscillator is formed by said inverter and said critical path including said plural input logical path.

15. The semiconductor integrated circuit of claim 14, wherein said critical path has an initial stage logical gate which is an inverter, and said dual input logical gate and said plural input logical gate are respectively dual input NAND gate.

16. The semiconductor integrated circuit of claim 14, wherein said critical path has an initial stage logical gate which is an inverter, said dual input logical gate is a dual input NOR gate and said plural input logical gate is a dual input NOR gate.

17. The semiconductor integrated circuit of claim 14, further comprising:

an input buffer, to which said particular level signal is input; and an output buffer, from which an oscillation signal of said ring oscillator is output.

18. A semiconductor integrated circuit which is evaluated for its function by automatically wiring and arranging logical paths with a net list of a built-in function circuit as an input, extracting a critical path having a largest delay time in a combinational circuit included in said function circuit and measuring a delay time of said critical path, said semiconductor integrated circuit comprising:

a plurality of flip-flops, which are arranged in an input side;

a plurality of flip-flops, which are arranged in an output side;

a combinational circuit, which includes a plurality of paths and is formed by a cascade connection of various logical gates for interconnecting said input side plurality of flip-flops and said output side plurality of flip-flops;

an input buffer, to which a particular level signal for evaluation testing is input;

a first NAND gate, to one input end of which an output of a critical path having a largest delay time in said combinational circuit is connected, and another input end of which is connected to an output end of said input buffer;

an output buffer, which is connected to an output end of said NAND gate; and a second NAND gate, which is arranged instead of an inverter originally arranged in an initial stage of said critical path when function evaluation is performed, one input end of which said first NAND gate is connected, and to another input end of which said input side plurality of flip-flops are connected, wherein when said function evaluation is performed, a ring oscillator is formed by said first NAND gate and said critical path including said second NAND gate, and when said particular level signal is output from said input buffer, an oscillation signal of said ring oscillator from said output buffer is detected.

19. The semiconductor integrated circuit of claim 18, wherein a first NOR gate and a second NOR gate are arranged instead of said first and second NAND gates.

20. A semiconductor integrated circuit which is evaluated for its function by performing automatic wiring arranging with a netlist of a built-in function circuit as an input, extracting a critical path having a largest delay time in a combinational circuit included in said function circuit and measuring a delay time of said critical path, said semiconductor integrated circuit comprising:

a plurality of flip-flops, which are arranged in an input side;

a plurality of flip-flops, which are arranged in an output side;

a combinational circuit, which includes a plurality of paths and is formed by cascade connection of various logical gates for interconnecting said input side plurality of flip-flops and said output side plurality of flip-flops;

an inverter, to an input end of which an output of a critical path having a largest delay time in said combinational circuit is connected;

an input buffer, to which a particular level signal for evaluation testing is input;

a first NAND gate, to one input end of which an output end of said inverter is connected, and another input end of which is connected to an output end of said input buffer;

an output buffer, which is connected to an output end of said first NAND gate; and a second NAND gate, which is arranged instead of said inverter originally arranged in an initial stage of said critical path when function evaluation is performed, to one input end of which an output end of said first NAND gate is connected, to another input end of which said input side plurality of flip-flops are connected;

wherein when said function evaluation is performed, a ring oscillator is formed by said first NAND gate and said critical path including said second NAND gate, and when said particular level signal is output from said input buffer, an oscillation signal of said ring oscillator from said output buffer is detected.

21. The semiconductor integrated circuit of claim 20, wherein a first NOR gate and a second NOR gate are arranged instead of said first and second NAND gates.

22. An evaluating method of a semiconductor integrated circuit used during designing and alternatively AC testing, said evaluating method comprising:

a first step for inputting a net list of a desired function;

a second step for receiving said net list input in said first step and performing automatic arranging and wiring on a chip, including a function circuit, of said semiconductor integrated circuit;

a third step for performing delay analysis for all of a plurality of paths in a combinational circuit, which is included in said function circuit of said semiconductor integrated circuit;

a fourth step for extracting a critical path having a largest delay time among said plurality of paths in said combinational circuit based on a result of said delay analysis;

a fifth step for arranging and connecting a plurality of particular input logical gates for testing instead of a logical gate in an initial stage of said critical path and forming a ring oscillator including said critical path; and a sixth step for performing AC testing for evaluation by setting said ring oscillator to an oscillation mode and measuring a frequency of its oscillation output by using a frequency counter.

* * * * *